US009333599B2

(12) United States Patent
de Bock et al.

(10) Patent No.: US 9,333,599 B2
(45) Date of Patent: May 10, 2016

(54) ELECTRONICS CHASSIS AND METHOD OF FABRICATING THE SAME

(71) Applicant: General Electric Company, Schenectady, NY (US)

(72) Inventors: Hendrik Pieter Jacobus de Bock, Clifton Park, NY (US); Stanton Earl Weaver, Jr., Broadalbin, NY (US); Tao Deng, Shanghai (CN); Jay Todd Labhart, Corsicana, TX (US); Pramod Chamarthy, Revere, MA (US); Shakti Singh Chauhan, Guilderland, NY (US); Graham Charles Kirk, Milton Keynes (GB); Brian Patrick Hoden, Huntsville, AL (US)

(73) Assignee: General Electric Company, Niskayuna, NY (US)

( * ) Notice: Subject to any disclaimer, the term of this patent is extended or adjusted under 35 U.S.C. 154(b) by 208 days.

(21) Appl. No.: 14/135,678

(22) Filed: Dec. 20, 2013

(65) Prior Publication Data

US 2015/0181763 A1    Jun. 25, 2015

(51) Int. Cl.
*H05K 7/20* (2006.01)
*B23P 15/26* (2006.01)
*H05K 9/00* (2006.01)

(52) U.S. Cl.
CPC .......... *B23P 15/26* (2013.01); *H05K 7/20681* (2013.01); *H05K 9/0062* (2013.01); *B23P 2700/09* (2013.01); *B23P 2700/10* (2013.01); *Y10T 29/49826* (2015.01)

(58) Field of Classification Search
CPC .. B23P 15/26; B23P 2700/09; B23P 2700/10; H05K 9/0062; H05K 7/20681; H05K 7/20509; H05K 7/20418; H05K 7/20245; H05K 9/0007; H05K 7/20336; H05K 7/1412; Y10T 29/49826
USPC ..................................... 361/688–723; 29/428
See application file for complete search history.

(56) References Cited

U.S. PATENT DOCUMENTS

| 6,388,882 | B1 | 5/2002 | Hoover et al. |
| 6,418,017 | B1 | 7/2002 | Patel et al. |
| 6,722,581 | B2 | 4/2004 | Saddoughi |
| 7,606,029 | B2 | 10/2009 | Mahalingam et al. |
| 7,607,470 | B2 | 10/2009 | Glezer et al. |
| 7,688,583 | B1 | 3/2010 | Arik et al. |
| 7,869,216 | B2 | 1/2011 | Stevenson et al. |
| 7,990,705 | B2 | 8/2011 | Bult et al. |
| 8,006,917 | B2 | 8/2011 | Arik et al. |
| 8,120,908 | B2 | 2/2012 | Arik et al. |

(Continued)

OTHER PUBLICATIONS http://www.businesswire.com/news/home/20121211006129/en/GE-Cooling-Technology-Thin-Credit-Card-Enables.

(Continued)

*Primary Examiner* — Anthony Haughton
*Assistant Examiner* — Yahya Ahmad
(74) *Attorney, Agent, or Firm* — John P. Darling

(57) ABSTRACT

An electronics chassis is provided. The electronics chassis includes a plurality of panels that define an interior space. One panel of the plurality of panels has a composite segment having an internal face and an external face. The electronics chassis further includes a conductive thermal pathway that extends through the panel from the internal face of the composite segment to the external face of the composite segment.

20 Claims, 7 Drawing Sheets

(56) References Cited

U.S. PATENT DOCUMENTS

Figure 1:
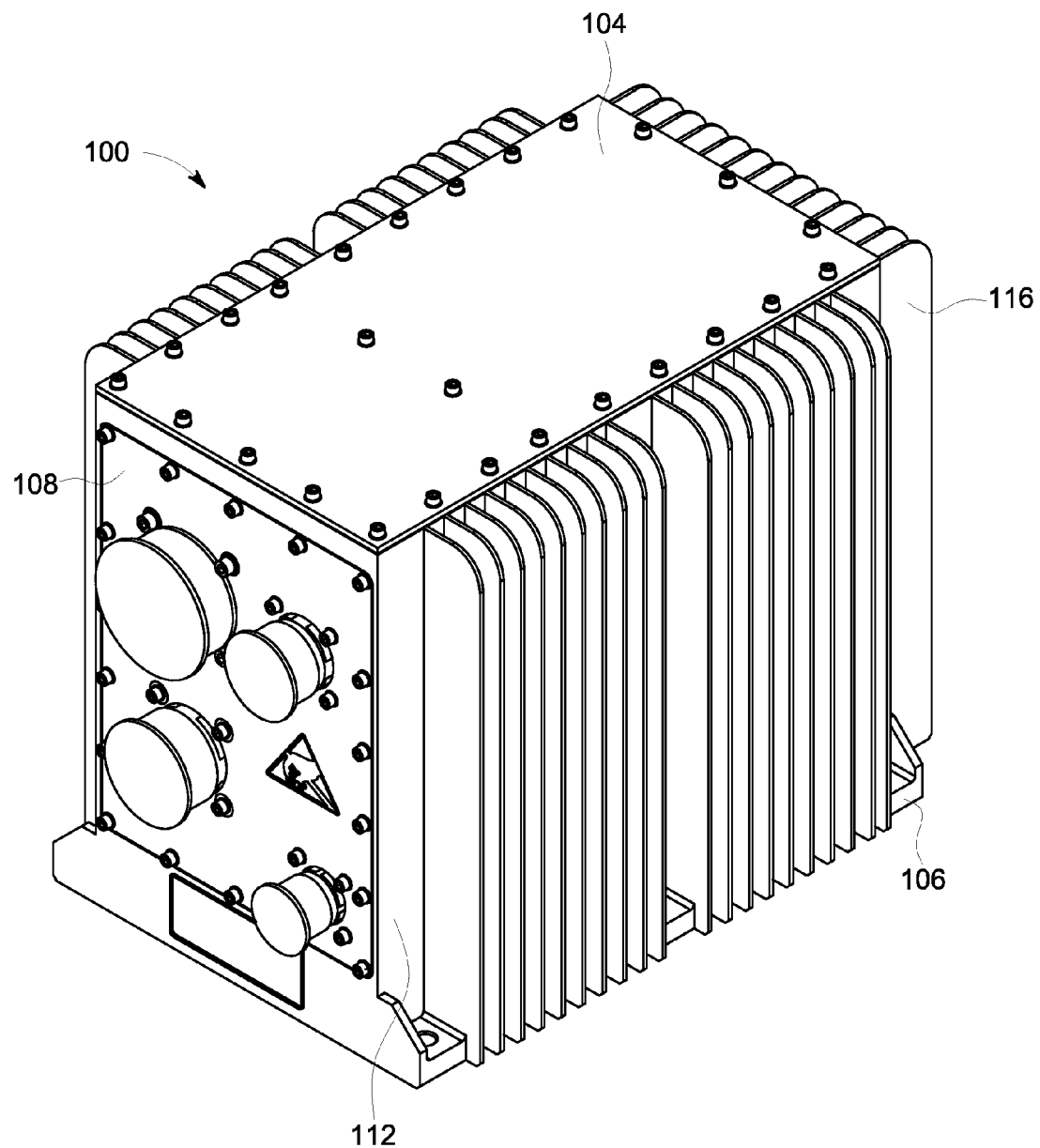

| | | |
|---|---|---|
| 8,136,767 B2 | 3/2012 | Cueman et al. |
| 8,308,078 B2 | 11/2012 | Arik et al. |
| 8,430,644 B2 | 4/2013 | Mahalingam et al. |
| 2003/0128515 A1 | 7/2003 | Faneuf et al. |
| 2004/0118553 A1 | 6/2004 | Krassowski et al. |
| 2006/0133033 A1* | 6/2006 | Straub ............... H05K 7/20563 361/690 |
| 2006/0146496 A1 | 7/2006 | Asfia et al. |
| 2006/0289149 A1* | 12/2006 | He ..................... H01L 23/4006 165/104.33 |
| 2007/0041160 A1* | 2/2007 | Kehret ............... H05K 7/20445 361/704 |
| 2008/0218980 A1* | 9/2008 | Tracewell .......... H05K 7/20672 361/713 |
| 2008/0278912 A1* | 11/2008 | Zavadsky ................. H04Q 1/02 361/697 |
| 2009/0117386 A1* | 5/2009 | Vacanti ................... B32B 27/00 428/408 |
| 2010/0046170 A1* | 2/2010 | Stevenson ............ H05K 9/0083 361/708 |
| 2010/0053891 A1 | 3/2010 | Arik et al. |
| 2010/0053901 A1 | 3/2010 | Irving et al. |
| 2010/0054973 A1 | 3/2010 | Arik et al. |
| 2010/0296250 A1 | 11/2010 | Huang et al. |
| 2010/0319948 A1 | 12/2010 | Vander Ploeg et al. |
| 2011/0141692 A1 | 6/2011 | Bult |
| 2011/0267776 A1* | 11/2011 | Porreca .............. H05K 7/20545 361/694 |
| 2011/0316416 A1 | 12/2011 | Han et al. |
| 2012/0018537 A1 | 1/2012 | Arik et al. |
| 2012/0020017 A1* | 1/2012 | Kehret .................... G06F 1/183 361/679.54 |
| 2012/0170216 A1 | 7/2012 | Arik et al. |
| 2013/0048264 A1 | 2/2013 | Lu et al. |
| 2013/0322024 A1 | 12/2013 | Tantolin et al. |
| 2014/0174693 A1* | 6/2014 | Wong ................. H05K 7/20409 165/56 |
| 2015/0013941 A1* | 1/2015 | Wong ................. H05K 7/20663 165/104.21 |

OTHER PUBLICATIONS

SIE Computing Solutions, ATR Chassis, Version 1, Exploded View, p. 3.
http://files.theskywardblog.com/wp-content/uploads/2012/08/20120731_AUVSI_presentation_Thermal_Management1.pdf.
http://defense.ge-ip.com/products/magic1/p2077.
http://defense.ge-ip.com/products/crs-d5i-3vc1/p3618.
U.S. Appl. No. 13/586,260, filed Aug. 15, 2012 (Unpublished).
U.S. Appl. No. 13/709,469, filed Dec. 10, 2012 (Unpublished).
European Search Report and Opinion issued in connection with corresponding EP Application No. 14197921.1 on Jun. 19, 2015.

* cited by examiner

ELECTRONICS CHASSIS AND METHOD OF FABRICATING THE SAME

BACKGROUND

The subject matter described herein relates generally to an electronics system and, more particularly, to a chassis for an electronics system.

Many modern electronics systems function using at least one circuit card assembly. Most known circuit card assemblies include a printed circuit board on which at least one chip (or other electronic component) is mounted. The circuit card assemblies are typically mounted within a chassis that facilitates supporting the circuit card assemblies and protecting the circuit card assemblies from external influences such as extreme temperature, moisture, debris, and electromagnetic interference (EMI).

Moreover, the various chips of each circuit card assembly generate heat during operation of the electronics system, and it is desirable to remove the heat from these chips with reduced temperature rise over ambient in order to keep them functioning properly. In that regard, the chassis is commonly placed in conductive heat transfer with the circuit card assembly to facilitate conductively removing heat from the circuit card assembly. The exterior surfaces of the chassis then convectively dissipate the heat into the ambient air surrounding the chassis. As such, it is common for the chassis to be made entirely of a high thermal conductivity metal, such as aluminum, so as to provide adequate mechanical support to, and heat transfer from, the circuit card assemblies. However, an entirely metal chassis is often heavier than desirable.

BRIEF DESCRIPTION

In one aspect, an electronics chassis is provided. The electronics chassis includes a plurality of panels that define an interior space. One panel of the plurality of panels has a composite segment having an internal face and an external face. The electronics chassis further includes a conductive thermal pathway that extends through the panel from the internal face of the composite segment to the external face of the composite segment.

In another aspect, a method of fabricating an electronics chassis is provided. The method includes coupling a plurality of panels together to define an interior space. One panel of the plurality of panels has a composite segment having an internal face and an external face. The method further includes coupling a conductive thermal pathway to the panel such that the thermal pathway extends through the panel from the internal face of the composite segment to the external face of the composite segment.

In another aspect, an electronics system is provided. The electronics system includes a circuit card assembly and a chassis. The chassis includes a plurality of panels that define an interior space in which the circuit card assembly is mounted. One panel of the plurality of panels has a composite segment having an internal face and an external face. The chassis further includes a conductive thermal pathway extending through the panel from the internal face of the composite segment to the external face of the composite segment.

DRAWINGS

Figure 2:
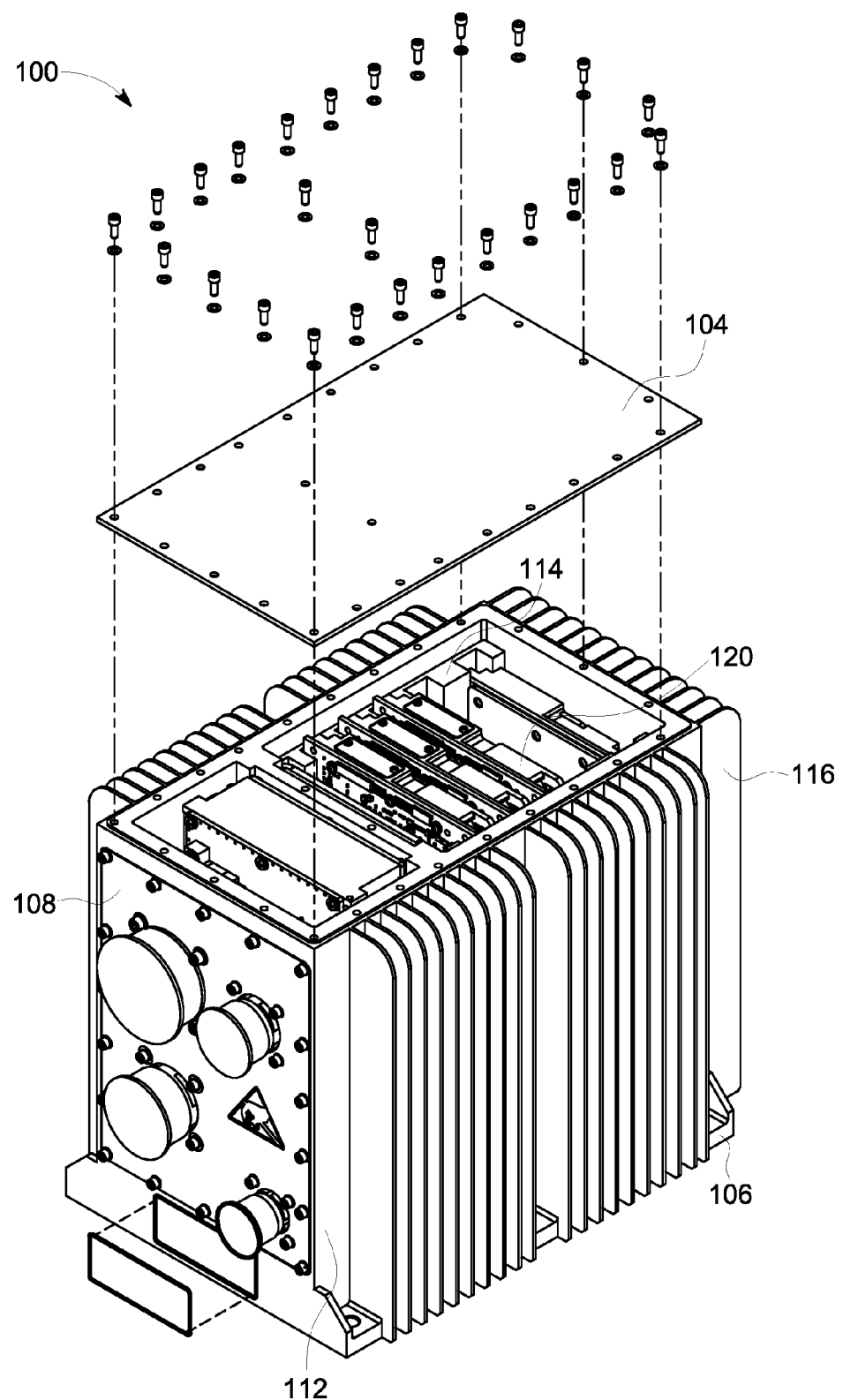
Figure 3:
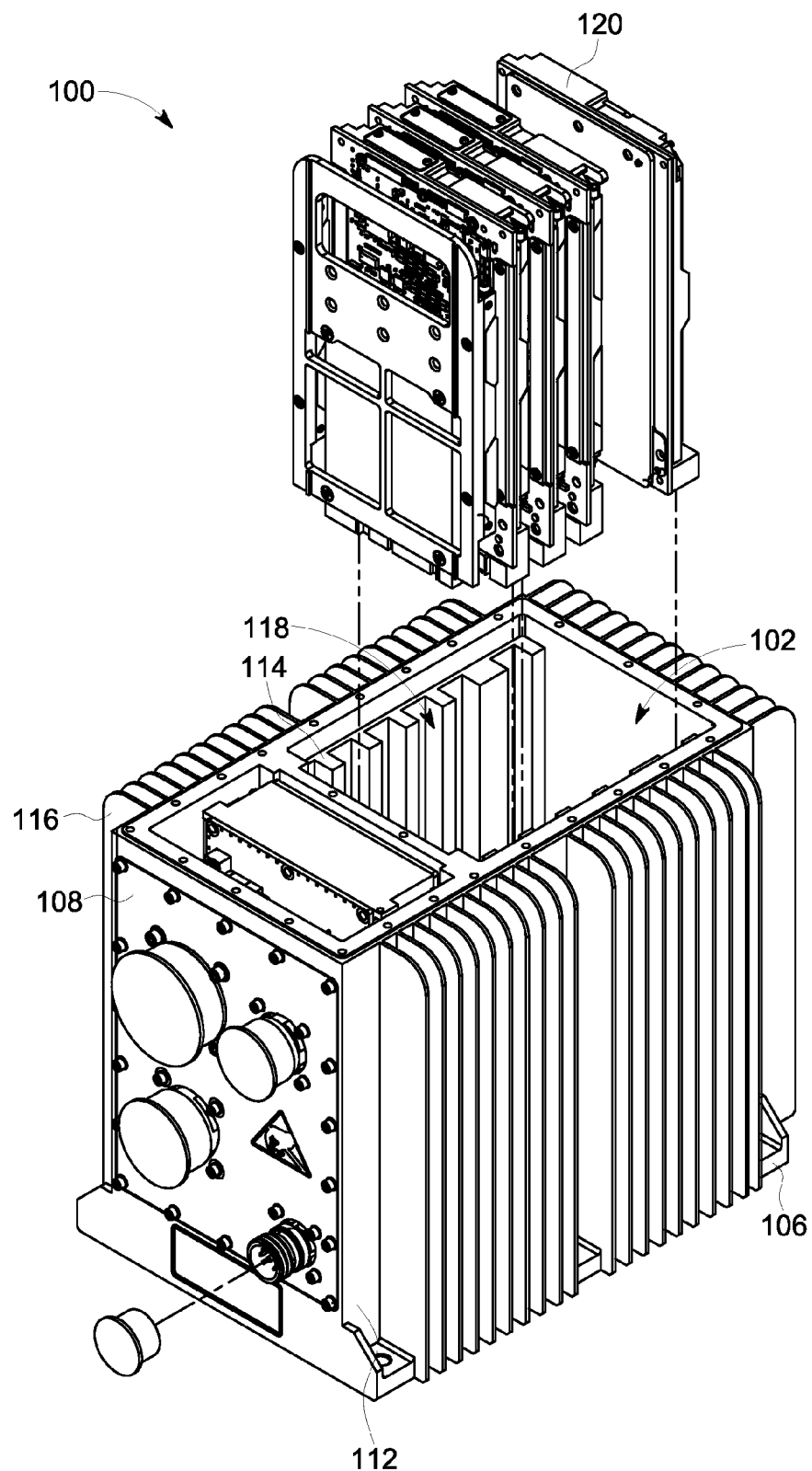
Figure 4:
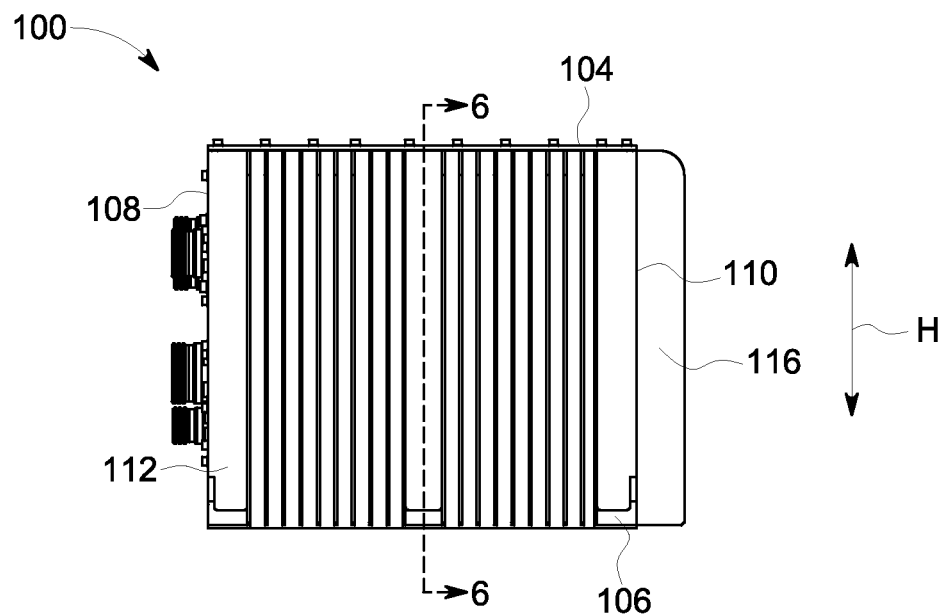
Figure 5:
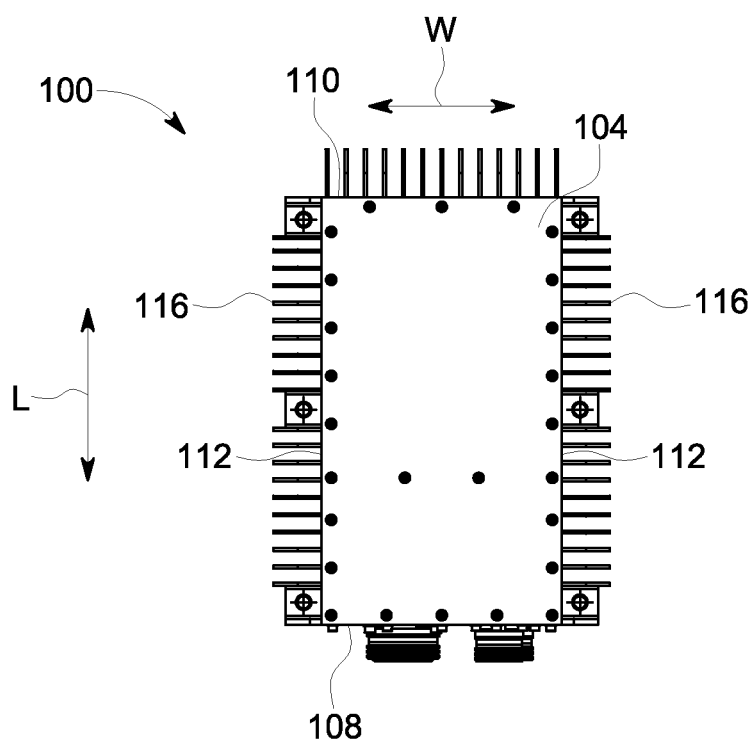
Figure 6:
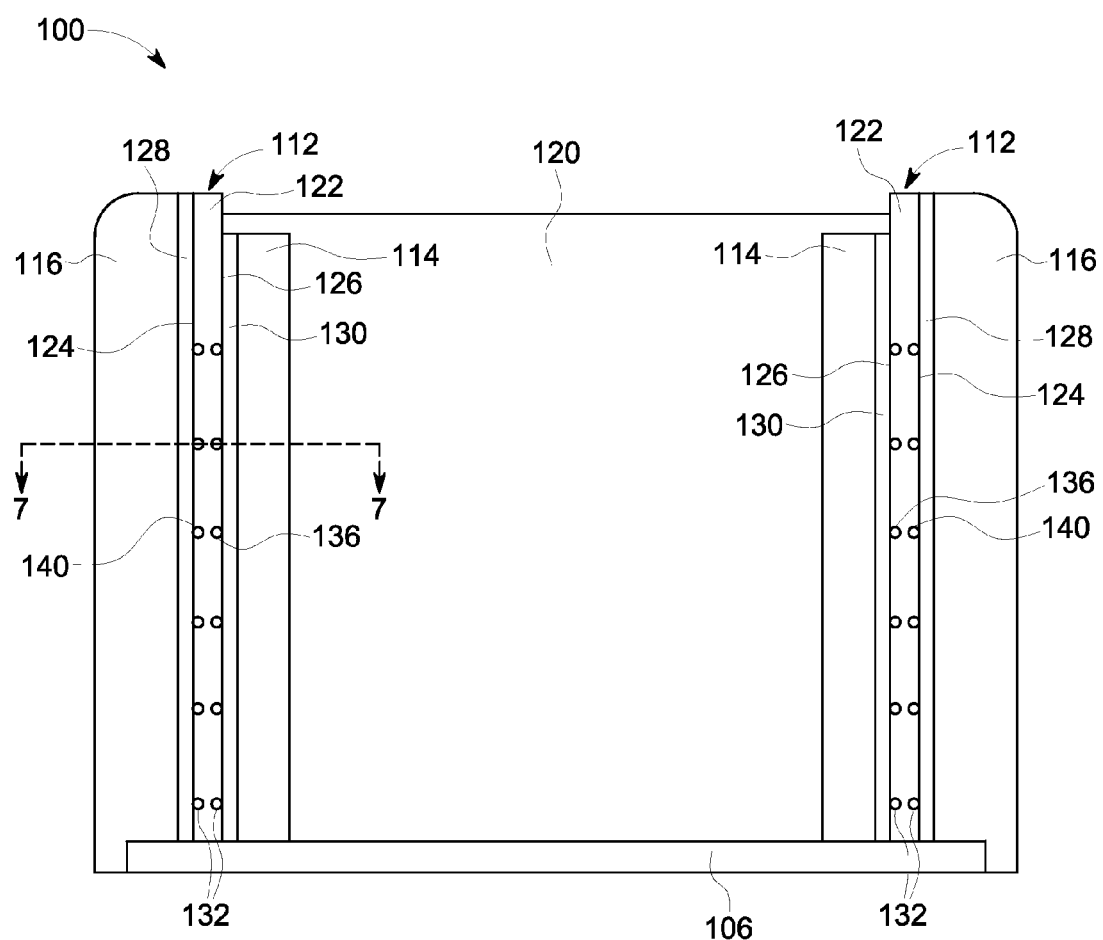
Figure 7:
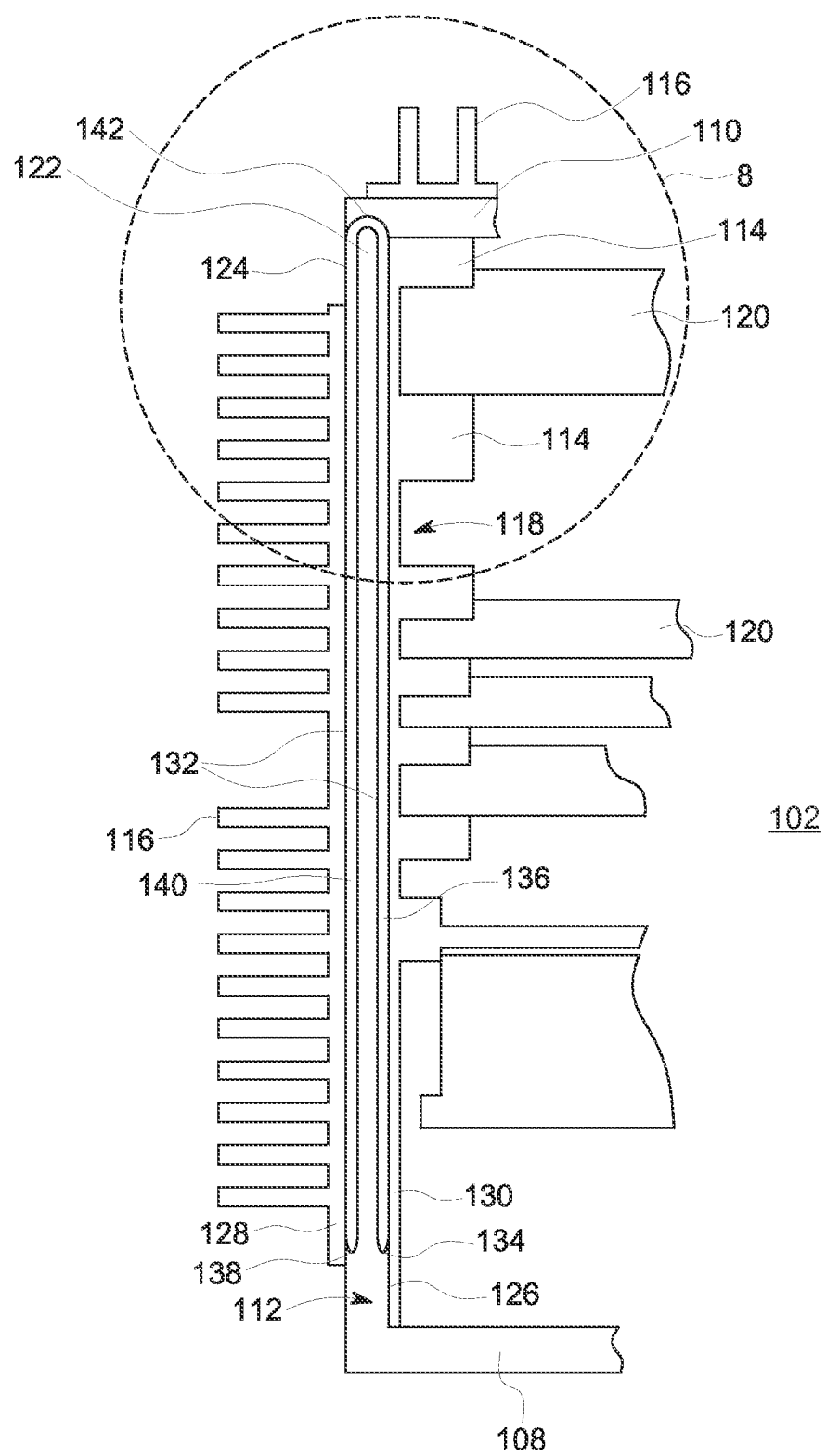
Figure 8:
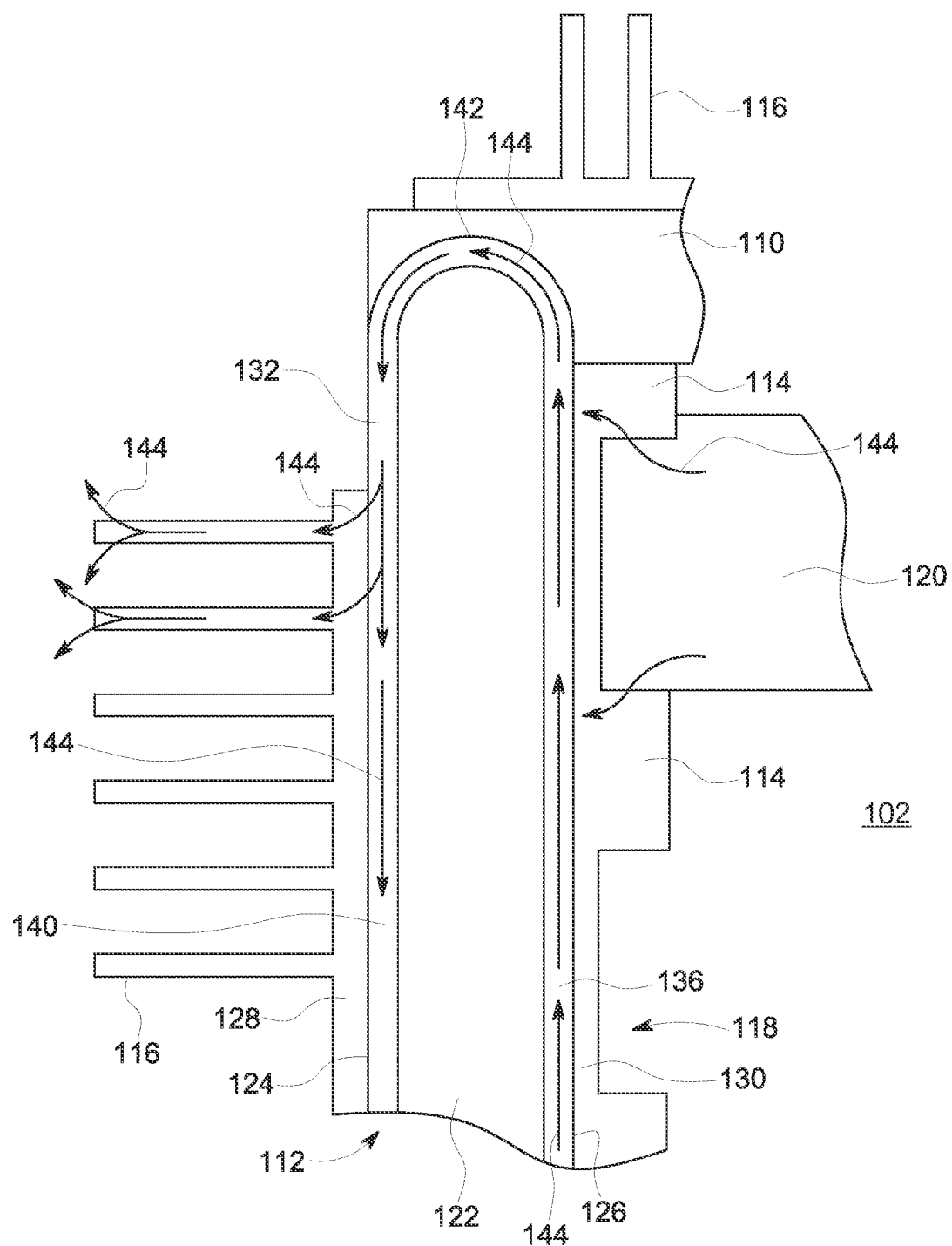

These and other features, aspects, and advantages of the present disclosure will become better understood when the following detailed description is read with reference to the accompanying drawings in which like characters represent like parts throughout the drawings, wherein:

FIG. 1 is a perspective view of an exemplary chassis;
FIG. 2 is an exploded view of the chassis shown in FIG. 1;
FIG. 3 is another exploded view of the chassis shown in FIG. 1;
FIG. 4 is a side view of the chassis shown in FIG. 1;
FIG. 5 is a top view of the chassis shown in FIG. 1;
FIG. 6 is a schematic cross-sectional view of a portion of the chassis shown in FIG. 4 taken along line 6-6 with a top panel removed;
FIG. 7 is a schematic cross-sectional view of the portion of the chassis shown in FIG. 6 taken along line 7-7; and
FIG. 8 is an enlarged view of the portion of the chassis shown in FIG. 7 taken within area 8.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

The embodiments disclosed herein facilitate providing an electronics system with a lightweight chassis having circuit card assemblies mounted therein. The embodiments further facilitate providing an air-tight chassis that has predominantly nonmetallic panels and is configured to cool a circuit card assembly supported by the chassis. The devices, systems, and methods disclosed herein also facilitate conductively cooling a plurality of circuit card assemblies disposed within a composite-paneled chassis using a plurality of thermal pathways leading from the interior of the chassis to the exterior of the chassis. As such, the embodiments disclosed herein facilitate reducing thermal resistance in a processor of a circuit card assembly so as to mitigate a temperature rise in the processor during operation, thereby facilitating an increase of processor power capacity. The devices, systems, and methods further facilitate providing a composite-paneled chassis that reduces electromagnetic interference (EMI) with a circuit card assembly disposed within the chassis. In this manner, the embodiments facilitate providing a chassis that has an effective mechanical support function using a lightweight composite structure, an effective heat-removing function using thermal pathways incorporated into the composite structure, and an effective EMI-reducing function using EMI-reducing materials incorporated into the composite structure, such that the chassis provides an improved performance over weight ratio. With these benefits, the embodiments facilitate enabling an avionics system to function more effectively in military environments having extreme temperature gradients and high shock/vibration.

FIGS. 1-5 are various views of a chassis 100. In the exemplary embodiment, chassis 100 has an interior space 102 (shown in FIG. 3) defined by an arrangement of panels, namely a removable top panel 104 (removed in FIG. 3), a bottom panel 106 (not shown in FIG. 5), a front panel 108, a back panel 110 (shown in FIGS. 4 and 5), and a pair of side panels 112. As used herein, the term "forward" and variations thereof are directional modifiers intended to indicate a direction from back panel 110 toward front panel 108, and the term "rearward" and variations thereof are directional modifiers intended to indicate a direction from front panel 108 toward back panel 110. Similarly, as used herein, the term "upward" and variations thereof are directional modifiers intended to indicate a direction from bottom panel 106 toward top panel 104, and the term "downward" and variations thereof are directional modifiers intended to indicate a direction from top panel 104 toward bottom panel 106. As such, a lengthwise dimension L (only shown in FIG. 5) of chassis 100 extends through front panel 108 and back panel 110, a widthwise dimension W (only shown in FIG. 5) of chassis 100 extends through side panels 112, and a heightwise dimension H (only shown in FIG. 4) of chassis 100 extends through top panel 104 and bottom panel 106.

In the exemplary embodiment, chassis 100 has a plurality of internal rails 114 (shown in FIGS. 2 and 3) and a plurality of external fins 116 that are fabricated from a conductive material, e.g., without limitation, an aluminum material. Fins 116 extend in heightwise dimension H and are spaced apart from one another in lengthwise dimension L along side panels 112 and in widthwise dimension W along back panel 110. Rails 114 extend in heightwise dimension H and are spaced apart from one another in lengthwise dimension L along side panels 112 so as to collectively define a plurality of slots 118 (shown in FIG. 3). Each slot 118 is sized to receive a circuit card assembly 120 (shown in FIGS. 2 and 3) in a slidable manner for suitably retaining circuit card assemblies 120 within interior space 102, e.g., without limitation, via suitable wedge lock mechanisms of circuit card assemblies 120. In some embodiments, rather than being disposed on side panels 112, rails 114 may be disposed on front panel 108 and back panel 110 (or, alternatively, on top panel 104 and bottom panel 106 if top panel 104 is rendered irremovable) to essentially reorient slots 118 within interior space 102. Moreover, fins 116 may be disposed on any suitable one (or combination) of top panel 104, front panel 108, back panel 110, and side panels 112 in other embodiments. Alternatively, while chassis 100 is shown as having a particular quantity of rails 114 and fins 116 in the exemplary embodiment, chassis 100 may have any suitable quantity of rails 114 and fins 116 in other embodiments.

In the exemplary embodiment, top panel 104, bottom panel 106, front panel 108, back panel 110, and side panels 112 are joined together to completely enclose circuit card assemblies 120 such that interior space 102 is sealed in an air-tight manner. Thus, chassis 100 facilitates protecting circuit card assemblies 120 from debris, extreme temperature, and/or electromagnetic interference (EMI) as set forth in more detail below. In alternative embodiments, however, chassis 100 may permit ambient airflow through interior space 102 and over circuit card assemblies 120. As used herein, the term "airtight" refers to chassis 100 being sealed such that airflow into or out of interior space 102 is substantially mitigated. Optionally, in other embodiments, chassis 100 may not be air-tight but, rather, may be suitably configured to substantially mitigate an inflow of dust, sand, and/or other airborne particulates.

In one embodiment, at least some of top panel 104, bottom panel 106, front panel 108, back panel 110, and side panels 112 are integrally formed together using a molding process such as, for example, a casting process (for panels that are at least in part fabricated from a metallic material) or an injection molding process (for panels that are at least in part fabricated from a composite material). In another embodiment, at least some of top panel 104, bottom panel 106, front panel 108, back panel 110, and side panels 112 may be molded (or otherwise formed) separately from, and subsequently joined to, one another using suitable mechanical joints and/or bonding agents such as, for example, solder or adhesive. Optionally, chassis 100 may include a structural framework (or skeleton) to which top panel 104, bottom panel 106, front panel 108, back panel 110, and side panels 112 are joined. For example, without limitation, chassis 100 may have a metallic or composite skeleton defining windows over which (or pockets into which) top panel 104, bottom panel 106, front panel 108, back panel 110, and side panels 112 are to be inserted or otherwise coupled.

FIG. 6 is a schematic cross-sectional view of a portion of chassis 100 taken along line 6-6 of FIG. 4 with top panel 104 removed. In the exemplary embodiment, each side panel 112 has a composite segment (or core) 122 having an external face 124 and an internal face 126. Composite segment 122 is sandwiched at least in part between a conductive fin plate 128 (or spreader) suitably fastened to external face 124, and a conductive rail plate 130 (or spreader) suitably fastened to internal face 126. Fins 116 are integrally formed with and project outwardly from fin plate 128, and rails 114 are integrally formed with and project inwardly from rail plate 130. In some embodiments, chassis 100 may not include fin plate 128 and/or rail plate 130 such that fins 116 and/or rails 114 are individually coupled to composite segment 122 in any suitable manner. Notably, while side panels 112 are described herein as having composite segment 122, it is contemplated that top panel 104, bottom panel 106, front panel 108, and/or back panel 110 may also be fabricated in whole, or in part, from a composite material.

In the exemplary embodiment, each side panel 112 includes a plurality of separate thermal pathways 132 embedded in composite segment 122, and each thermal pathway 132 is situated in conductive heat transfer, e.g., without limitation, direct, physical contact, with fin plate 128 and rail plate 130 such that thermal pathways 132 extend through side panel 112 from internal face 126 of composite segment 122 to external face 124 of composite segment 122. For example, without limitation, thermal pathways 132 may extend directly through or around composite segment 122 so as to traverse composite segment 122 when extending through side panel 112 from internal face 126 of composite segment 122 to external face 124 of composite segment 122. Notably, each thermal pathway 132 may be a single, unitary conductive member or a plurality of separate conductive members that are coupled together. Alternatively, rather than utilizing a plurality of separate thermal pathways 132, side panel 112 may utilize only one thermal pathway 132 or a single network of interconnected thermal pathways 132 to facilitate enabling chassis 100 to function as described herein. Moreover, the shape of each thermal pathway 132 may be selected to suit desired heat transfer properties and available space.

In some embodiments, thermal pathways 132 may be integrated into support members, e.g., without limitation, support beams, of a structural skeleton of chassis 100. Or, thermal pathways 132 may themselves provide structural support for chassis 100 such that thermal pathways 132 effectively function as a structural skeleton of chassis 100, e.g., without limitation, thermal pathways 132 may be rigid enough to act as support beams of chassis 100. Optionally, top panel 104, bottom panel 106, front panel 108, and/or back panel 110 may be fabricated in the same manner as side panels 112, e.g., without limitation, they may have the same arrangement of rails 114, fins 116, composite segment 122, fin plate 128, rail plate 130, and/or thermal pathways 132 that is set forth herein for side panels 112.

Each thermal pathway 132 is fabricated from a conductive material. In the exemplary embodiment, each thermal pathway 132 is a sealed, two-phase, capillary heat pipe that is fabricated from a copper material (so as to be bendable) and houses a wick and a working liquid, e.g., without limitation, a butane liquid or an ammonia liquid. In other embodiments, at least some thermal pathways 132 may be fabricated from other suitable conductive materials, e.g., without limitation, solid metal, graphite, diamond, or graphene. For example, in one embodiment, a solid-material thermal pathway extends parallel to each sealed, two-phase, capillary heat pipe such that, if the heat pipe offers limited performance, heat can still be effectively removed from circuit card assemblies 120 as described herein using the solid-material thermal pathway in lieu of (or in addition to) the heat pipe. Alternatively, at least some thermal pathways 132 may utilize other suitable devices such as oscillating heat pipes, vapor chambers, fluid-filled chambers, thermosiphons, or phase change materials, e.g., without limitation, a wax material. Optionally, thermal pathways 132 may also utilize thermoelectric coolers, dual piezoelectric cooling jets (DCJ), fans (for forced-air cooling), or pumps (for forced-liquid cooling) to facilitate operation of chassis 100 as described herein. For example, without limitation, fins 116 may be somewhat enclosed for forced-air cooling by either an embedded fan or ducted air.

As used herein, the term "non-conductive" refers to having a high volume resistivity, e.g., without limitation, a volume resistivity that is greater than or equal to $10^2$ Ohm-m at 20 degrees Celsius (° C.). By contrast, the term "conductive" refers to having a low volume resistivity, e.g., without limitation, a volume resistivity that is less than $10^2$ Ohm-m at 20° C. Notably, the term "volume resistivity" refers the ability of a material to oppose the flow of electric current. Moreover, as used herein, the term "composite" refers to a non-metallic material that is non-conductive, such as a thermosetting polymer resin or a thermoplastic polymer resin having a conductive or non-conductive filler of high mechanical strength, thermal conductivity, and resin adhesion. For example, without limitation, suitable thermosetting polymer resins may include epoxy, polyimide, ester, cyanate ester, polycyanurate, vulcanized rubber, urethane, Duroplast, or Bakelite. Additionally, suitable thermoplastic polymer resins may include, without limitation, acrylic, nylon, polyethylene, polypropylene, polystyrene, polyvinyl chloride, or polytetrafluoroethylene. Furthermore, suitable fillers may include, without limitation, carbon, ceramic, metallic, or glass fillers in the form of fibers, plates, sheets, spheres, dendrites, or any other suitable shapes that facilitate attaining suitable mechanical, thermal, and electrical properties.

FIG. 7 is a schematic cross-sectional view of the portion of chassis 100 shown in FIG. 6 taken along line 7-7, and FIG. 8 is an enlarged view of the portion of chassis 100 shown in FIG. 7 taken within area 8. In the exemplary embodiment, each thermal pathway 132 has a generally U-shaped profile with a first end 134, a first leg segment 136, a second end 138, a second leg segment 140, and a turnabout segment 142. First end 134 is disposed near front panel 108, and first leg segment 136 extends rearward from first end 134 adjacent internal face 126 of composite segment 122 so as to span a plurality of rails 114 while being situated in conductive heat transfer, e.g., without limitation, direct, physical contact, with rail plate 130. Similarly, second end 138 is disposed near front panel 108, and second leg segment 140 extends rearward from second end 138 adjacent external face 124 of composite segment 122 so as to span a plurality of fins 116 while being situated in conductive heat transfer, e.g., without limitation, direct, physical contact, with fin plate 128. Turnabout segment 142 is disposed near back panel 110 and joins first leg segment 136 to second leg segment 140 such that each thermal pathway 132 spans substantially the entire length of its respective side panel 112.

During operation, each circuit card assembly 120 generates heat 144, and heat 144 is removed from circuit card assemblies 120 in the following manner. Heat 144 from each circuit card assembly 120 is conductively transferred to rails 114 between which each circuit card assembly 120 is retained. Heat 144 from rails 114 is then conductively transferred to rail plate 130, and heat 144 from rail plate 130 is then conductively transferred to first leg segments 136 of thermal pathways 132 by virtue of first leg segments 136 being in conductive heat transfer with rail plate 130. In this manner, first leg segments 136 are heated by circuit card assemblies 120. By contrast, because fins 116 are on the exterior of chassis 100, fins 116 are cooled by the ambient air surrounding chassis 100. Fins 116 therefore conductively cool fin plate 128, which in turn conductively cools second leg segments 140 of thermal pathways 132 by virtue of being in conductive heat transfer with second leg segments 140. In this manner, second leg segments 140 are cooled by the ambient air surrounding chassis 100. More specifically, for each thermal pathway 132, second leg segment 140 is maintained at a cooler temperature than first leg segment 136 during operation of circuit card assemblies 120.

With each thermal pathway 132 being a sealed, two-phase, capillary heat pipe in the exemplary embodiment, first leg segment 136 (which is heated by circuit card assemblies 120) functions as an evaporator region of the heat pipe, and second leg segment 140 (which is cooled by ambient air surrounding chassis 100) functions as a condenser region of the heat pipe. As such, heat 144 transferred to first leg segment 136 from rail plate 130 causes the working liquid within first leg segment 136 to evaporate such that the vapor travels along the heat pipe toward second leg segment 140 due to second leg segment 140 being at a cooler temperature than first leg segment 136. Within second leg segment 140, the vapor condenses due to the cooler temperature of second leg segment 140, and the condensate is then wicked back toward first leg segment 136 to again be evaporated. When the vapor condenses within second leg segment 140, second leg segment 140 conductively transfers heat 144 to fin plate 128, which in turn conductively transfers heat 144 to fins 116. Heat 144 from fins 116 is then convectively transferred to the ambient air surrounding chassis 100, thereby completing the heat transfer path from circuit card assemblies 120 within chassis 100 to the ambient air surrounding chassis 100. This heat transfer cycle continuously repeats itself during the operation of circuit card assemblies 120 such that thermal pathways 132 function to actively cool circuit card assemblies 120.

In one embodiment, rather than being oriented as set forth in the exemplary embodiment, each thermal pathway 132 is oriented such that first end 134 and second end 138 are near back panel 110, while turnabout segment 142 is near front panel 108. In another embodiment, each thermal pathway 132 extends in heightwise dimension H along its respective composite segment 122 such that first leg segment 136 and second leg segment 140 are oriented substantially parallel with rails 114 and fins 116. In such an embodiment, turnabout segment 142 is located near top panel 104 or bottom panel 106, rather than being located near back panel 110 as set forth in the exemplary embodiment. In some embodiments, thermal pathways 132 are embedded in rails 114 and/or fins 116, rather than being embedded in composite segment 122 as set forth in the exemplary embodiment. Alternatively, in other embodiments, bottom panel 106 is fabricated from a conductive material, e.g., without limitation, bottom panel 106 may itself be a cold plate, and thermal pathways may transfer heat from rails 114 to bottom panel 106 (in addition to, or in lieu of, transferring heat to fins 116) for removing heat from circuit card assemblies 120, such that chassis 100 may be convection-cooled and/or conduction-cooled. As a further alternative embodiment, bottom panel 106 has a composite segment and a cold plate external of the composite segment such that thermal pathways transfer heat from rails 114 through (or around) the composite segment of bottom panel 106 and to the cold plate (in addition to, or in lieu of, transferring heat to fins 116) such that chassis 100 may be convection-cooled and/or conduction-cooled. This is similar to the manner by which thermal pathways 132 transfer heat through (or around) composite segments 122 of side panels 112 in the exemplary embodiment.

Optionally, chassis 100 is configured to reduce electromagnetic interference (EMI). In some embodiments, the existing structures of the chassis embodiments set forth above, e.g., without limitation, thermal pathways 132 or the skeleton of chassis 100, effectively reduce EMI. In other embodiments, it is beneficial to incorporate additional EMI-reducing structures into the chassis embodiments set forth above. Suitable options for adding EMI-reducing structures to chassis 100 include: metallization; overlapping joints; embedded wire mesh; cage structure; metal foils; chopped metal strands, e.g., without limitation, copper, in the filler material of composite segment 122; gaskets made of silver-plated aluminum in fluorosilicone; gaskets having conductive fabric over foam closures; beryllium copper (BeCu) finger stock joints; or vents with EMI air filters. In one particular example, the panels of chassis 100 that utilize composite material are coated internally with a metallic material, or have an embedded metallic screen that effectively functions as a Faraday cage. In another example, the joints between adjacent panels are provided with interlocking lips, e.g., without limitation, a tongue-and-groove connection, that facilitate a labyrinth-type seal, and/or the joints are provided with electrically conductive O-rings. Moreover, in some embodiments, the panels that utilize composite material suitably include embedded metal inserts that facilitate fastening the panels together at the joints, e.g., without limitation, via screws that are closely spaced together to maintain a continuous metal-to-metal contact along the joints.

The above-described embodiments facilitate providing an electronics system with a lightweight chassis having circuit card assemblies mounted therein. The embodiments further facilitate providing an air-tight chassis that has predominantly nonmetallic panels and is configured to cool a circuit card assembly supported by the chassis. The devices, systems, and methods disclosed above also facilitate conductively cooling a plurality of circuit card assemblies disposed within a composite-paneled chassis using a plurality of thermal pathways leading from the interior of the chassis to the exterior of the chassis. As such, the embodiments disclosed herein facilitate reducing thermal resistance in a processor of a circuit card assembly so as to mitigate a temperature rise in the processor during operation, thereby facilitating an increase of processor power capacity. The devices, systems, and methods further facilitate providing a composite-paneled chassis that reduces electromagnetic interference (EMI) with a circuit card assembly disposed within the chassis. As such, the embodiments facilitate providing a chassis that has an effective mechanical support function using a lightweight composite structure, an effective heat-removing function using thermal pathways incorporated into the composite structure, and an effective EMI-reducing function using EMI-reducing materials incorporated into the composite structure, such that the chassis provides an improved performance over weight ratio. With these benefits, the embodiments facilitate enabling an avionics system to function more effectively in military environments having extreme temperature gradients and high shock/vibration.

Exemplary embodiments of an electronics chassis and methods of fabricating the same are described above in detail. The systems and methods are not limited to the specific embodiments described herein, but rather, components of the systems and/or steps of the methods may be utilized independently and separately from other components and/or steps described herein. For example, the methods may also be used in combination with other systems, and are not limited to practice with only the avionics-related systems described herein. Rather, the embodiments may be implemented and utilized in connection with many other applications outside of aviation.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electronics chassis comprising:
a plurality of panels that define an interior space, wherein at least one panel of said plurality of panels comprises a composite segment having an internal face and an external face; and
a conductive thermal pathway extending through said panel from said internal face of said composite segment to said external face of said composite segment, wherein the thermal pathway is embedded in the composite segment and is one of a sealed, two-phase, capillary heat pipe, an oscillating heat pipe, a vapor chamber, and a thermosiphon, the at least one panel comprises a plurality of internal rails on the internal face and a plurality of external fins on the external face, the thermal pathway being in conductive heat transfer with said internal rails and said external fins, and the thermal pathway is generally U-shaped and has a first leg segment adjacent the plurality of internal rails on the internal face of the composite segment and a second leg segment adjacent the external fins on the external face of the composite segment.

2. The electronics chassis in accordance with claim 1, wherein said composite segment is configured to reduce electromagnetic interference (EMI).

3. The electronics chassis in accordance with claim 1, wherein said chassis comprises a cold plate.

4. The electronics chassis in accordance with claim 1, wherein the composite segment is formed of a non-conductive material having a volume resistivity of at least 100 Ω·m at 20°C.

5. The electronics chassis in accordance with claim 4, wherein the composite segment is formed of a thermosetting polymer resin comprising expoxy, polyimide, ester, cyanate ester, polycyanurate, vulcanized rubber, urethane, Duroplast, or Bakelite.

6. The electronics chassis in accordance with claim 4, wherein the composite segment is formed of a thermoplastic polymer resin comprising acrylic, nylon, polyethylene, polypropylene, polystyrene, polyvinylchloride, or polytetrafluoroethylene.

7. The electronics chassis in accordance with claim 5, wherein the composite segment includes fillers of carbon, ceramic, metal, or glass in the form of fibers, plates, sheets, spheres, or dendrites.

8. The electronics chassis in accordance with claim 6, wherein the composite segment includes fillers of carbon, ceramic, metal, or glass in the form of fibers, plates, sheets, spheres, or dendrites.

9. The electronics chassis in accordance with claim 4, wherein the thermal pathway comprises a material having a volume resistivity less than 100 Ω·m at 20°C.

10. The electronics chassis in accordance with claim 1, wherein thermal pathway is a sealed, two-phase capillary heat pipe formed of copper and including a wick and a working liquid.

11. The electronics chassis in accordance with claim 10, wherein the working liquid is butane.

12. The electronics chassis in accordance with claim 10, wherein the working liquid is ammonia.

13. An electronics system comprising:
an electronic chassis in accordance with claim 1; and
a circuit card assembly mounted in the interior space of the electronic chassis.

14. An electronics system comprising:
electronic chassis in accordance with claim 4; and
a circuit card assembly mounted in the interior space of the electronic chassis.

15. An electronics system comprising:
an electronic chassis in accordance with claim 5; and
a circuit card assembly mounted in the interior space of the electronic chassis.

16. An electronics system comprising:
an electronic chassis in accordance with claim 6; and
a circuit card assembly mounted in the interior space of the electronic chassis.

17. An electronics system comprising:
an electronic chassis in accordance with claim 7; and
a circuit card assembly mounted in the interior space of the electronic chassis.

18. An electronics system comprising:
an electronic chassis in accordance with claim 8; and
a circuit card assembly mounted in the interior space of the electronic chassis.

19. An electronics system comprising:
an electronic chassis in accordance with claim 9; and
a circuit card assembly mounted in the interior space of the electronic chassis.

20. An electronics system comprising:
an electronic chassis in accordance with claim 10; and
a circuit card assembly mounted in the interior space of the electronic chassis.

* * * * *